(12) United States Patent
Keays

(10) Patent No.: US 8,074,122 B2
(45) Date of Patent: *Dec. 6, 2011

(54) PROGRAM FAILURE RECOVERY

(75) Inventor: Brady Keays, Half Moon Bay, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/861,262

(22) Filed: Aug. 23, 2010

(65) Prior Publication Data

US 2010/0325479 A1 Dec. 23, 2010

Related U.S. Application Data

(63) Continuation of application No. 12/144,778, filed on Jun. 24, 2008, now Pat. No. 7,783,934, which is a continuation of application No. 11/491,331, filed on Jul. 21, 2006, now Pat. No. 7,401,267, which is a continuation of application No. 10/431,767, filed on May 8, 2003, now Pat. No. 7,392,436.

(51) Int. Cl.
*G06F 11/00* (2006.01)

(52) U.S. Cl. ........................................... 714/52

(58) Field of Classification Search .............. 714/2–8, 714/15, 16, 18, 20, 25, 26, 27, 37–39, 42, 714/48, 52, 54

See application file for complete search history.

(56) References Cited

U.S. PATENT DOCUMENTS

| | | | |
|---|---|---|---|
| 4,578,751 A | 3/1986 | Erwin | |
| 4,580,261 A | 4/1986 | Pelotte | |
| 4,617,664 A | 10/1986 | Aichelmann et al. | |
| 5,502,728 A | 3/1996 | Smith, III | |
| 5,784,317 A * | 7/1998 | Ha | 365/185.22 |
| 5,832,204 A | 11/1998 | Apperley et al. | |
| 5,870,218 A | 2/1999 | Jyouno et al. | |
| 5,870,520 A | 2/1999 | Lee et al. | |
| 5,881,295 A | 3/1999 | Iwata | |
| 6,041,423 A | 3/2000 | Tsukerman | |
| 6,046,936 A | 4/2000 | Tsujikawa et al. | |
| 6,148,417 A * | 11/2000 | da Silva | 714/25 |
| 6,289,484 B1 | 9/2001 | Rothberg et al. | |
| 6,651,183 B1 | 11/2003 | Gensler, Jr. et al. | |
| 6,782,446 B2 | 8/2004 | Akey et al. | |
| 6,904,556 B2 | 6/2005 | Walton et al. | |
| 6,907,544 B2 * | 6/2005 | Kliegelhofer et al. | 714/6.12 |

(Continued)

FOREIGN PATENT DOCUMENTS

SU 964736 7/1982

*Primary Examiner* — Nadeem Iqbal
(74) *Attorney, Agent, or Firm* — Leffert Jay & Polglaze, P.A.

(57) ABSTRACT

A program failure is detected during programming of a memory device. When the program failure is detected, a transfer of the contents of a register of the memory device to a first location of a memory of the memory device is stopped. First data that remains in the register after the program failure is detected is transferred to a second location of the memory. At the second location of the memory, the first data is combined with second data from the first location of the memory that remains in the first location of the memory after the program failure is detected to reconstruct third data that was originally intended to be programmed in the first location before the program failure was detected.

24 Claims, 5 Drawing Sheets

U.S. PATENT DOCUMENTS

| | | |
|---|---|---|
| 6,972,993 B2 * | 12/2005 | Conley et al. ............ 365/185.04 |
| 7,111,224 B1 | 9/2006 | Trimberger |
| 7,392,436 B2 | 6/2008 | Keays |
| 7,401,267 B2 * | 7/2008 | Keays .............................. 714/52 |
| 2003/0033572 A1 | 2/2003 | Walton et al. |
| 2003/0117856 A1 | 6/2003 | Lee et al. |
| 2003/0217322 A1 | 11/2003 | Rodgers |
| 2004/0160829 A1 | 8/2004 | Tsujikawa et al. |
| 2004/0174741 A1 | 9/2004 | Tanaka |
| 2004/0237000 A1 * | 11/2004 | Keays ............................ 714/42 |
| 2006/0126394 A1 * | 6/2006 | Li ............................ 365/185.22 |
| 2006/0156192 A1 | 7/2006 | Nakamura et al. |

* cited by examiner

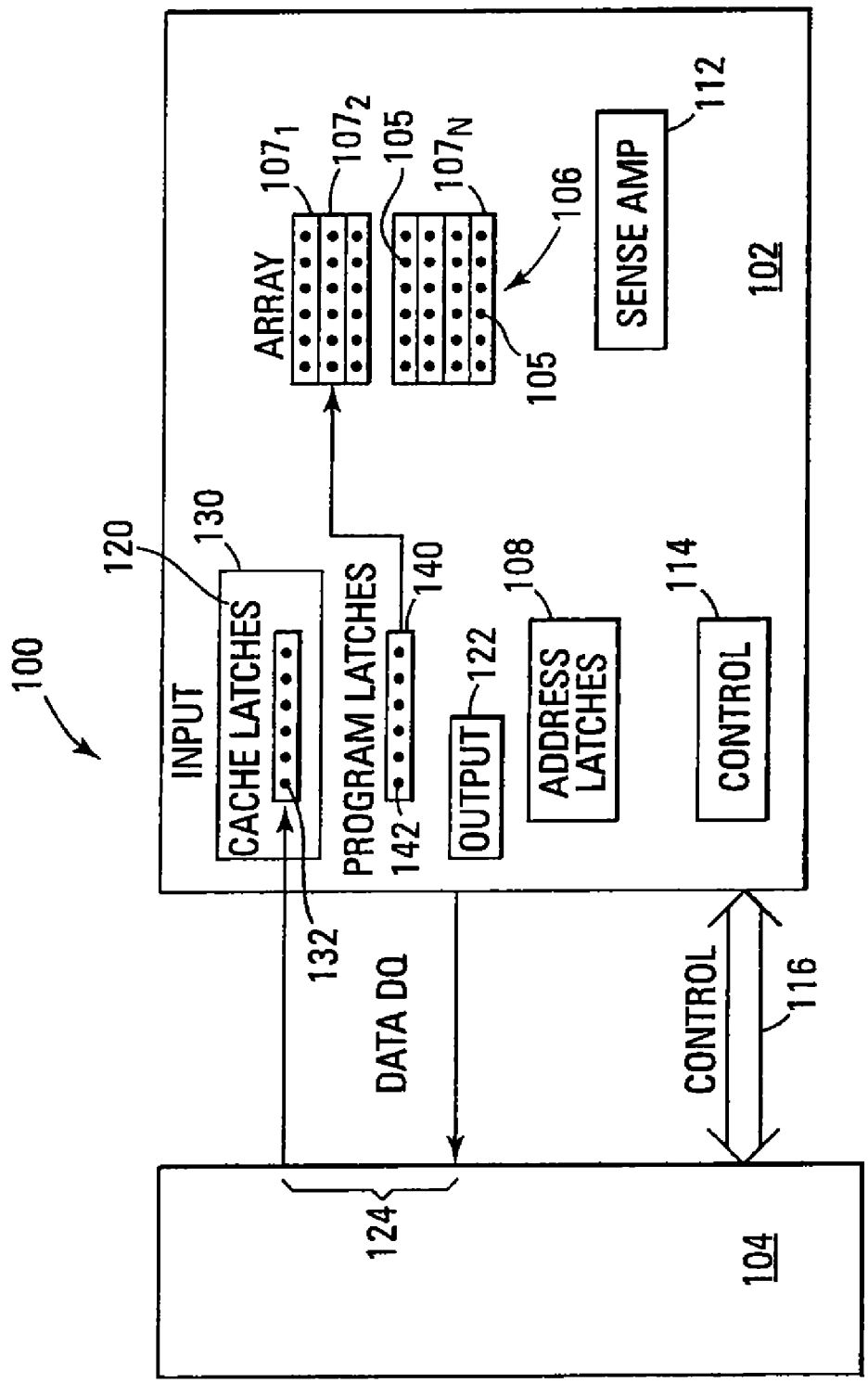

PROGRAM FAILURE RECOVERY

RELATED APPLICATIONS

This application is a continuation of U.S. patent application Ser. No. 12/144,778 (allowed), filed Jun. 24, 2008 now U.S. Pat. No. 7,783,934 and titled "PROGRAM FAILURE RECOVERY," which application is commonly assigned and incorporated by reference herein in its entirety and which application is a continuation of U.S. patent application Ser. No. 11/491,331 of the same title, filed Jul. 21, 2006 and issued as U.S. Pat. No. 7,401,267 on Jul. 15, 2008, which application is commonly assigned and incorporated by reference herein in its entirety and which application is a continuation of U.S. patent application Ser. No. 10/431,767 of the same title, filed May 8, 2003 and issued as U.S. Pat. No. 7,392,436 on Jun. 24, 2008, which application is commonly assigned and incorporated by reference herein in its entirety.

TECHNICAL FIELD OF THE INVENTION

The present invention relates generally to memory devices and in particular the present invention relates to the operation of memory devices when a program failure occurs.

BACKGROUND OF THE INVENTION

A flash memory device is a type of electrically erasable programmable read-only memory (EEPROM) and is used for non-volatile storage of data. Flash memory is being increasingly used to store execution codes and data in portable electronic products, such as computer systems.

A typical flash memory comprises a memory array having rows and columns of memory cells. Each of the memory cells is fabricated as a field-effect transistor having a control gate and a floating gate. The floating gate is capable of holding a charge and is separated by a thin oxide layer from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus, the data in a memory cell is determined by the presence or absence of a charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word-select line, and the drain region of each memory cell of a column of the array is connected to a bit line. The memory array for NOR flash memory devices is accessed by a row decoder activating a row of floating gate memory cells by selecting the word-select line coupled to their gates. The row of selected memory cells then place their data values on the column bit lines by flowing a differing current if in a programmed state or not programmed state from a coupled source line to the coupled column bit lines.

The array of memory cells for NAND flash memory devices is also arranged such that the control gate of each memory cell of a row of the array is connected to a word-select line. However, each memory cell is not directly coupled to a column bit line by its drain region. Instead, the memory cells of the array are arranged together in strings, typically of 16 each, with the memory cells coupled together in series, source to drain, between a source line and a column bit line.

The memory array for NAND flash memory devices is then accessed by a row decoder activating a row of memory cells by selecting the word-select line coupled to a control gate of a memory cell. In addition, the word-select lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

Many NAND flash memory devices provide two sets of registers (or latches) for use during program operations. These are usually referred to as cache latches and program latches. During programming operations, data are transferred from a host, such as a processor of a portable electronic product, into the cache latches. The data are then transferred from the cache latches into the program latches prior to the actual programming of a row of memory cells (commonly referred to as a page). This frees up the cache latches for additional data transfer from the host, while programming of the current data continues using the program latches in what is referred to as cache program operation.

In the event of a program failure, data transfer from the cache to program latches continues and the programming of this data in its specified location (or page) is still performed so that program data no longer remains within the flash device after a program operation has failed. A RAM buffer is often located externally to the flash device to retain the program data in case of failure. This data can be sent again to the flash device for programming in a new location (or page) as part of a recovery to ensure storage of the data.

The buffer size required for storing program data in case of failures is dictated by the page size of the flash memory. Therefore, as page size increases, e.g., due to increasing memory requirements, buffer size and thus buffer cost will increase.

For the reasons stated above, and for other reasons stated below which will become apparent to those skilled in the art upon reading and understanding the present specification, there is a need in the art for alternatives to using buffers for storing program data in case of failures.

BRIEF DESCRIPTION OF THE DRAWINGS

FIG. 1 is a block diagram of a flash memory system according to an embodiment of the present invention.

DETAILED DESCRIPTION

Figure 2A:
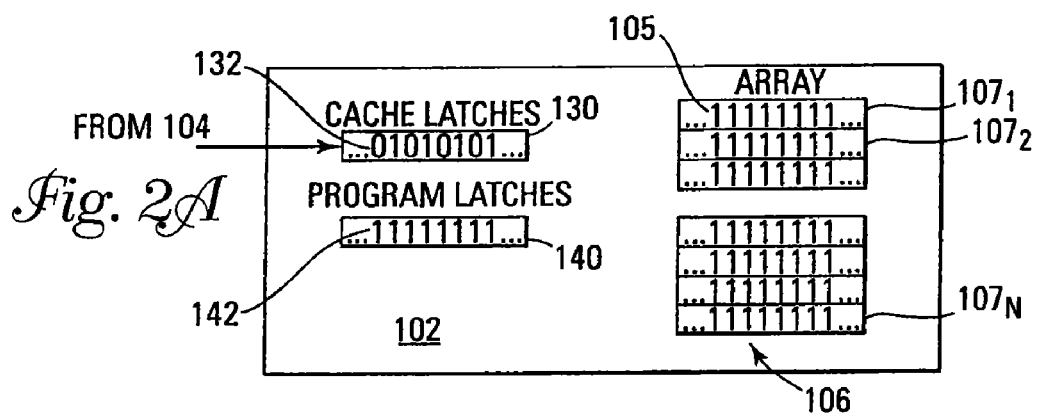
FIGS. 2A-2D illustrate data transfer during conventional programming of a memory array of the flash memory of FIG. 1.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a block diagram of a flash memory system 100 according to an embodiment of the present invention. Flash memory system 100 includes a memory (or mass storage) device 102, such as a NAND flash memory device, coupled to a processor or data controller 104. For one embodiment, memory device 102 includes an array 106 of individual storage locations (or memory cells) 105, e.g., flash memory cells, each cell having a distinct memory address. Array 106 is arranged in rows and columns, with the rows arranged in addressable blocks. For one embodiment, array 106 has rows (or pages) $107_1$ to $107_N$, as shown, where each of rows (or pages) $107_1$ to $107_N$ includes a plurality of memory cells 105. In other words, a plurality of memory cells 105 comprises one of rows (or pages) $107_1$ to $107_N$. Memory system 100 has been simplified to focus on features of the memory that are helpful in understanding the invention.

Data stored in the memory array 106 can be accessed using externally provided location addresses received by address latches 108 via a plurality of data (DQ) lines 124. Address signals are received and decoded to access the memory array 106. Sense amplifier and compare circuitry 112 is used to sense data stored in the memory cells and verify the accuracy of stored data. Command control circuit 114 decodes signals provided on control link 116 from the controller 104 and controls access to the memory cells of array 106. These signals are used to control the operations of the memory, including data read, data write, and erase operations.

A data input buffer circuit 120 and a data output buffer circuit 122 are included for bi-directional data communication over the plurality of data (DQ) lines 124 with the controller 102. For one embodiment, data input buffer circuit 120 includes cache latches (or data registers) 130. For another embodiment cache latches 130 include cache-latch cells 132 respectively corresponding to memory cells 105 of each of rows $107_1$ to $107_N$. Memory device 102 also includes program latches (or data registers) 140. For one embodiment, program latches 140 include program-latch cells 142 respectively corresponding to cache-latch cells 132 and of memory cells 105 of each of rows $107_1$ to $107_N$. For another embodiment, cache latches 130 are serially connected to program latches 140.

Figure 2B:
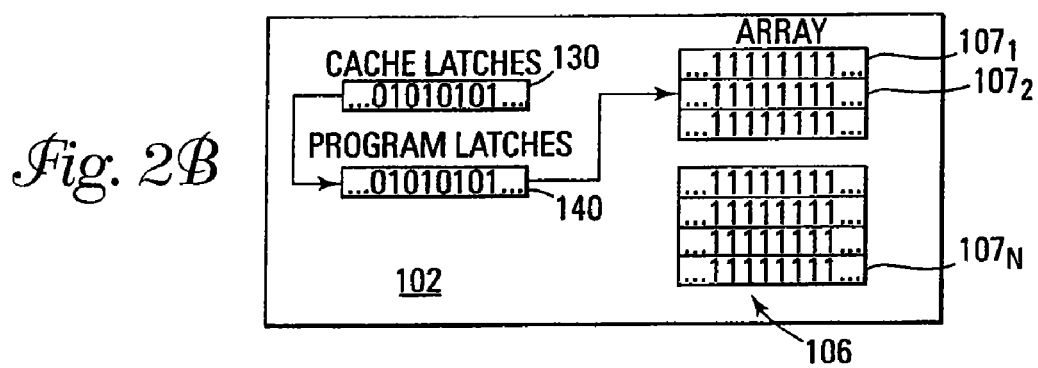
Figure 2C:
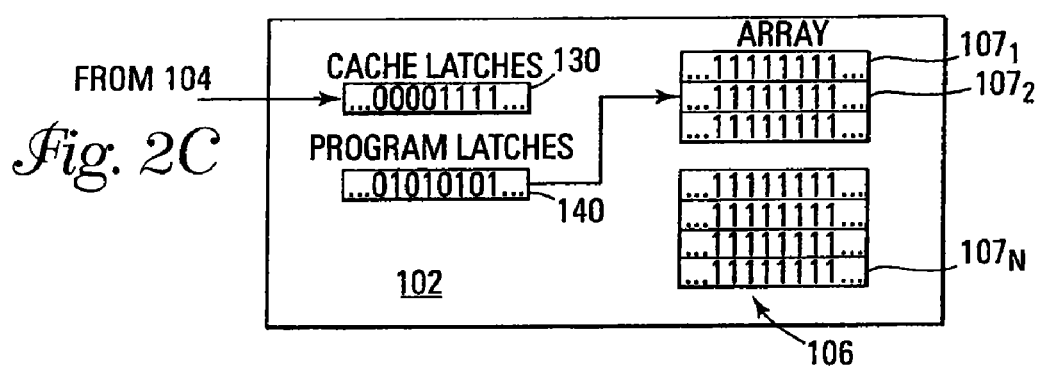
Figure 2D:
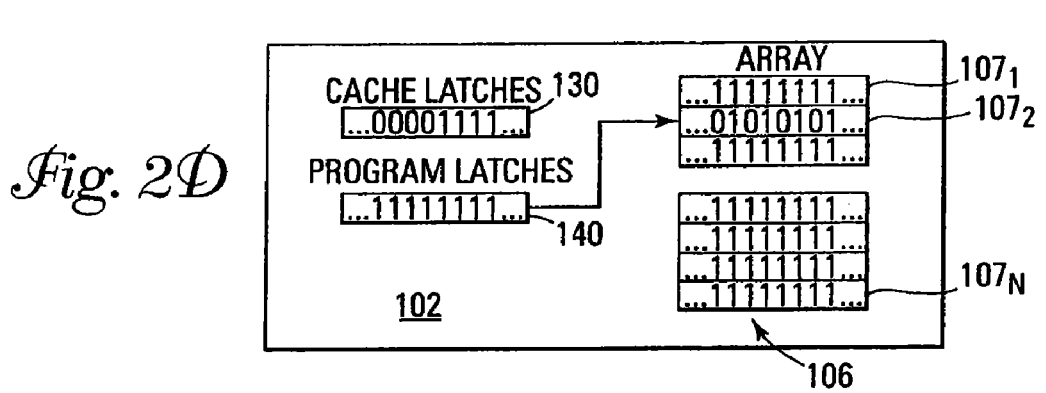

To program array 106, command control circuit 114 decodes program commands received from data controller 104. Programming of array 106 includes selecting a location within array 106 to program, e.g., row (or page) $107_2$ of array 106, as shown in FIG. 1. FIGS. 2A-2D illustrate data transfer during conventional programming of array 106. Data for row $107_2$ are transferred from controller 104 to cache latches 130, as shown in FIG. 2A. After the data for row $107_2$ are transferred to cache latches 130, these data are transferred from cache latches 130 to program latches 140, as shown in FIG. 2B, and programming of row $107_2$ commences. During programming of row $107_2$, another row of array 106 can be selected and data for that row can be transferred into cache latches 130 from controller 104, as shown in FIG. 2C. Also during programming of row $107_2$, the data for row $107_2$ are transferred from program latches 140 to row $107_2$, and the contents of program latches 140 are altered, as shown in FIG. 2D, e.g., returned to that of FIG. 2A.

Programming of row $107_2$ with the data of program latches 140 is accomplished by combining the data of row $107_2$ with the data of program latches 140 using a logical AND operation. For example, a zero (0) of the data of program latches 140 combined with a corresponding one (1) of the data of row $107_2$ using a logical AND causes a zero (0) to replace the one (1) in row $107_2$. A one (1) of the data of program latches 140 combined with a corresponding one (1) of the data of row $107_2$ using a logical AND produces a one (1) in row $107_2$. For one embodiment, programming row $107_2$ involves replacing the ones (1s) of row $107_2$ with the corresponding zeros (0s) of program latches 140.

The data are typically verified as they are transferred to row $107_2$, e.g., to determine if the data transferred to row $107_2$ matches the data previously in program latches 140. Note that the data in program latches 140 of FIG. 2C matches the data in row $107_2$ of FIG. 2D, indicating successful programming of row $107_2$. In one embodiment, as each memory cell 105 of row $107_2$ is programmed successfully (or verified) a one (1) is placed in a corresponding program-latch cell 142 of program latches 140. Note that each of the program-latch cells 142 of program latches 140 has one (1) in FIG. 2D, indicating that each of the corresponding memory cells 105 of row $107_2$ is verified and thus indicating successful programming of row $107_2$.

Figure 3A:
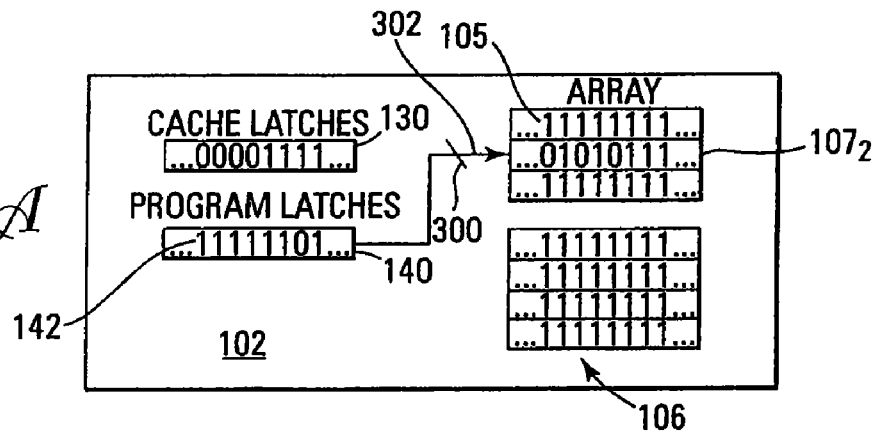
FIGS. 3A-3D illustrate data transfer during a method of operating a memory device when a program failure occurs according to an embodiment of the present invention.

If the data transferred to row $107_2$ does not match the data previously in program latches 140, a program failure occurs. This is illustrated by comparing the data in program latches 140 of FIG. 2C to the data in row $107_2$ (the failed location) of FIG. 3A. For one embodiment, when a memory cell of row $107_2$ fails to program (or verify) a zero (0) is placed in the corresponding program-latch cell 142 of program latches 140. For embodiments where programming row $107_2$ involves replacing the ones (1s) of row $107_2$ with the corresponding zeros (0s) of program latches 140, a program failure involves retaining a zero (0) in the program-latch cell 142 corresponding to the memory cell 105 of row $107_2$ where the failure occurred. Note that a zero (0) appears in program-latch cell 142 in program latches 140 in FIG. 3A indicative of the program failure in row $107_2$.

FIGS. 3A-3D illustrate data transfer within memory device 102 during a method 400, according to an embodiment of the present invention, of operating memory device 102 when a program failure is detected. For various embodiments, detecting a program failure involves command control circuit 114 detecting a zero (0) in program latches 140. A flowchart of method 400 is presented in FIG. 4. Command control circuit 114 is adapted to perform method 400 when a program failure is detected. Method 400 preserves the data within memory device 102 at block 410 when a program failure is detected. This is accomplished by stopping programming operations in progress before the program failure occurs when the program failure is detected. Stopping programming operations includes stopping the transfer of data to row $107_2$ from program latches 140 as indicated by a slash 300 passing through arrow 302 of FIG. 3A, and stopping altering the data within program latches 140. This preserves the data contained within row $107_2$ and program latches 140 at the time of the program failure. Stopping programming operations can also include stopping data transfer from controller 104 to cache latches 130 if data are being transferred from controller 104 to cache latches 130 when the program failure is detected and in another embodiment, stopping data transfer from cache latches 130 to program latches 140 if data are being transferred from cache latches 130 to program latches 140 when the program failure is detected. This preserves the data contained within cache latches 130 at the time of the program failure.

Figure 3B:
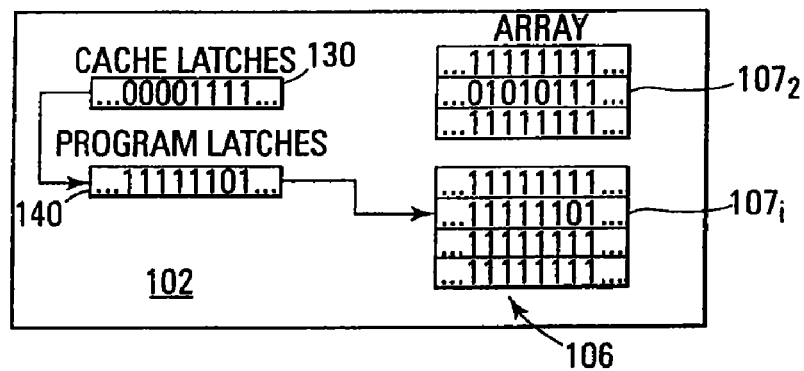
Figure 4:
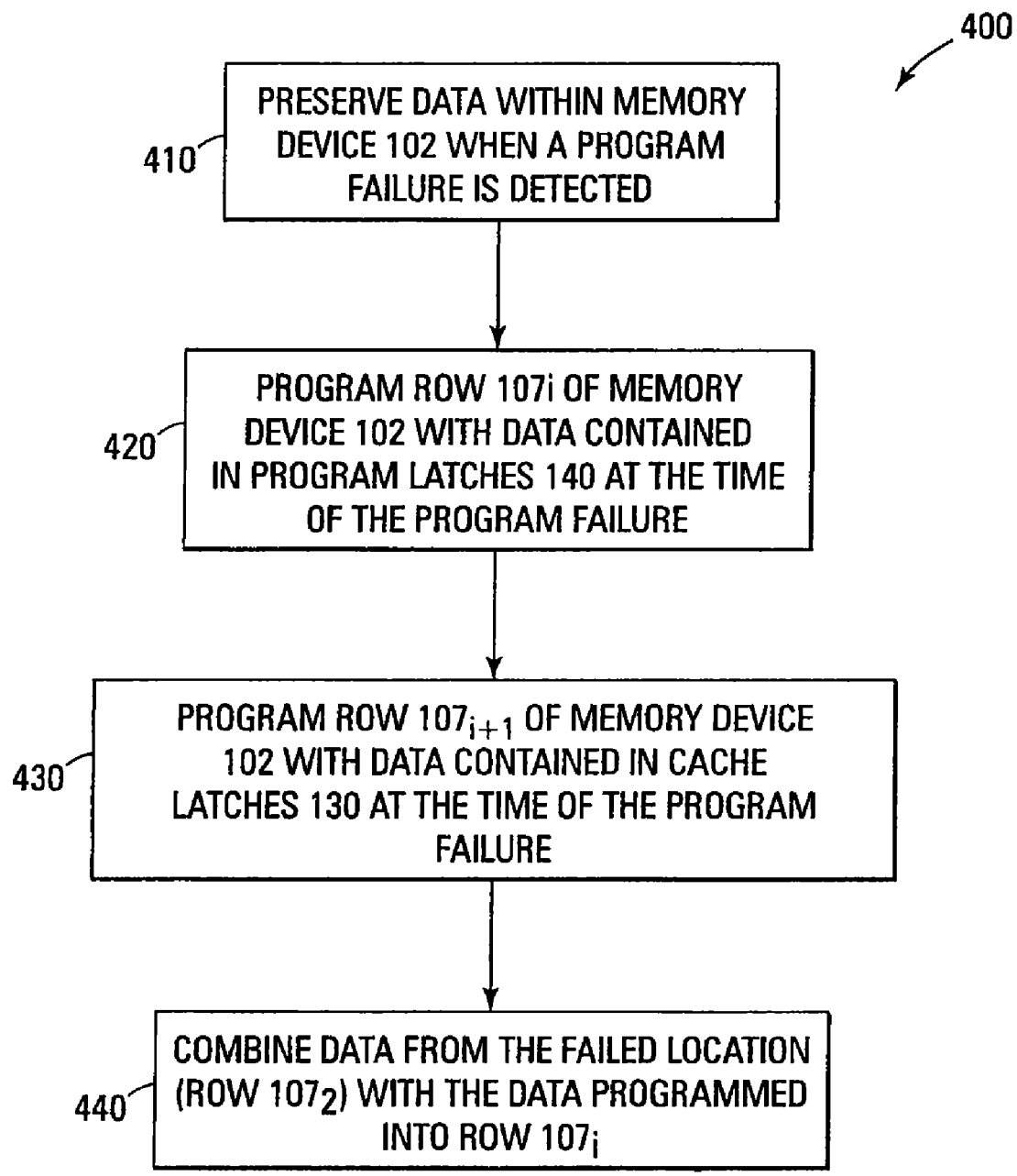
FIG. 4 is a flowchart of a method of operating a memory device when a program failure occurs according to another embodiment of the present invention.

At block 420, row (or page) 107$_i$, for example, is programmed using the data contained in program latches 140 at the time of the program failure. This includes selecting row 107$_i$ and transferring the data from program latches 140 to row 107$_i$, as shown in FIG. 3B.

Figure 3C:
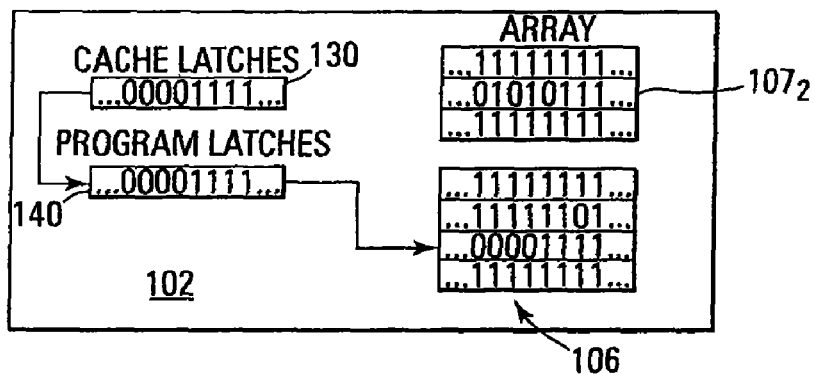

At block 430, row (or page) 107$_{i+1}$, for example, is programmed using the data contained in cache latches 130 at the time of the program failure. This includes selecting row 107$_{i+1}$, transferring the data from cache latches 130 to program latches 140, and transferring the data from program latches 140 to row 107$_{i+1}$, as shown in FIG. 3C.

Figure 3D:
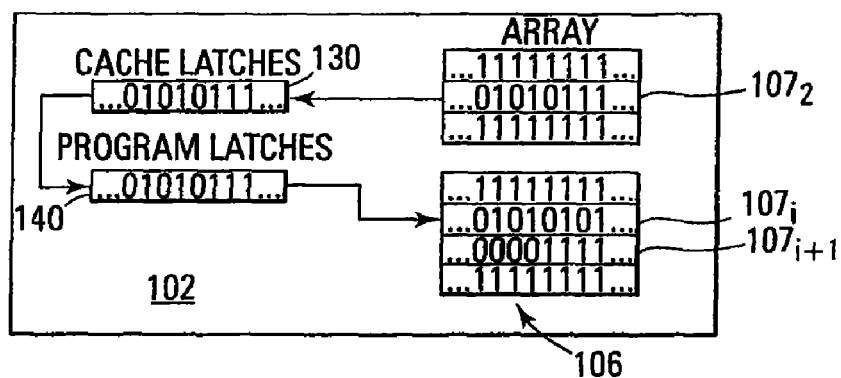

At block 440 failed data from row 107$_2$ is combined with the data stored in row 107$_i$, e.g., by programming or copying the failed data from row 107$_2$ on top of the data stored in row 107$_i$. This reconstructs the data originally intended for row 107$_2$ at row 107$_i$ before the program failure, as shown in FIG. 3D. Note that the data in row 107$_i$ of FIG. 3D match those in program latches 140 (the data originally intended for row 107$_2$ before the program failure depicted in FIG. 3A) in FIG. 2C.

To combine failed data from row 107$_2$ with the data stored in row 107$_i$, the failed data are transferred from row 107$_2$ to cache latches 130, as shown in FIG. 3D. The failed data are then transferred from cache latches 130 to program latches 140 and subsequently to row 107$_i$. Transferring the failed data from program latches 140 to row 107$_i$ involves programming row 107$_i$ with the failed data from program latches 140. For one embodiment, the failed data from row 107$_2$ are combined with the data stored in row 107$_i$ using a logical AND operation as described above.

For one embodiment, row 107$_2$ is assigned a defective status and is treated as a defect to avoid accessing the failed data therein during operation of memory device 102.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory, the method comprising:
    transferring first data to a first location of the memory, the first data being data in a latch after a program failure is detected; and
    combining, at the first location of the memory, the first data and second data to reconstruct third data that was originally intended to be programmed in a second location of the memory before the program failure was detected, the second data being data in the second location of the memory after the program failure is detected.

2. The method of claim 1, wherein the latch is a first latch, and further comprising transferring fourth data from a second latch to a third location of the memory after the program failure is detected, wherein the fourth data is contained in the second latch after the program failure was detected.

3. The method of claim 2, wherein transferring the fourth data from the second latch to the third location of the memory comprises transferring the fourth data from the second latch to the first latch after the first data is transferred to the second location of the memory, and then transferring the fourth data from the first latch to the third location of the memory.

4. The method of claim 1, further comprising, after transferring the first data to the first location of the memory and before combining, at the first location of the memory, the first data and the second data, transferring the second data from the second location of the memory to the latch, wherein combining, at the first location of the memory, the first data and the second data to reconstruct the third data comprises transferring the second data from the latch to the first location of the memory.

5. The method of claim 4, wherein the latch is a first latch and wherein transferring the second data from the second location of the memory to the first latch comprises transferring the second data from the second location of the memory to a second latch and then transferring the second data to the first latch from the second latch.

6. The method of claim 1, further comprising receiving the second data at the second location of the memory from the latch during a programming operation before the program failure is detected.

7. The method of claim 6, wherein the latch is a first latch, and further comprising, receiving the second data at the first latch from a second latch during the programming operation before the program failure is detected.

8. The method of claim 7, further comprising receiving the second data at the second latch from an external device during the programming operation before the program failure is detected.

9. The method of claim 1, wherein the first data is different than the second data and the third data is different than the first and second data.

10. The method of claim 1, wherein the first and second locations of the memory are respectively first and second rows of memory cells.

11. The method of claim 10, wherein the first and second rows of memory cells each comprise a page of memory cells.

12. The method of claim 1, wherein the latch comprises cells respectively corresponding to memory cells at the first location.

13. A method of operating a memory, the method comprising:
    transferring first data to a first location of the memory, the first data being data in a register after a program failure is detected; and
    combining, at the first location of the memory, the first data and second data to reconstruct third data that was originally intended to be programmed in a second location of the memory before the program failure was detected, the second data being data in the second location of the memory after the program failure is detected.

14. The method of claim 13, further comprising stopping programming of the second location before the program failure occurs when the program failure is detected.

15. The method of claim 13, further comprising treating the second location as a defective location to avoid accessing the second data therein.

16. The method of claim 13, wherein combining, at the first location of the memory, the first data and second data to reconstruct the third data comprises copying the second data on top of the first data in the first location.

17. A memory device comprising:
a memory;
a latch; and
a command control circuit for controlling access to the memory, wherein the command control circuit is configured to perform a method comprising:
    transferring first data to a first location of the memory, the first data being data in the latch after a program failure is detected; and
    combining, at the first location of the memory, the first data and second data to reconstruct third data that was originally intended to be programmed in a second location of the memory before the program failure was detected, the second data being data in the second location of the memory after the program failure is detected.

18. The memory device of claim 17, wherein the second data in the second location of the memory is defective data.

19. The memory device of claim 17, wherein the method performed by the command control circuit further comprises avoiding accessing the second data in the second location after the third data is reconstructed.

20. A storage device comprising:
a memory;
a register; and
a command control circuit for controlling access to the memory, wherein the command control circuit is configured to perform a method comprising:
    transferring first data to a first location of the memory, the first data being data in the register after a program failure is detected; and
    combining, at the first location of the memory, the first data and second data to reconstruct third data that was originally intended to be programmed in a second location of the memory before the program failure was detected, the second data being data in the second location of the memory after the program failure is detected.

21. The storage device of claim 20, wherein the mass storage device is a flash memory device.

22. The storage device of claim 20, wherein the method performed by the command control circuit further comprises, after transferring the first data to the first location of the memory and before combining, at the first location of the memory, the first data and the second data, transferring the second data from the second location of the memory to the register, wherein combining, at the first location of the memory, the first data and the second data to reconstruct the third data comprises transferring the second data from the register to the first location of the memory.

23. The storage device of claim 22, wherein the register is a first register, and further comprising a second register, wherein transferring the second data from the second location of the memory to the first register comprises transferring the second data from the second location of the memory to the second register and then transferring the second data to the first register from the second register.

24. The storage device of claim 23, wherein the first and second registers are serially connected.

* * * * *